United States Patent [19]

Ohashi et al.

[11] Patent Number: 4,535,534
[45] Date of Patent: Aug. 20, 1985

[54] METHOD OF MOUNTING A SWITCH BODY ON A PRINTING WIRING BOARD OR PANEL

[75] Inventors: Shigeo Ohashi; Hiroyuki Suga, both of Tokyo, Japan

[73] Assignee: Nihon Kaiheiki Kogyo Kabushiki Kaisha, Tokyo, Japan

[21] Appl. No.: 538,878

[22] Filed: Oct. 4, 1983

Related U.S. Application Data

[63] Continuation-in-part of Ser. No. 284,913, Jul. 20, 1981, abandoned.

[30] Foreign Application Priority Data

Jul. 31, 1980 [JP] Japan .................................. 55-109354

[51] Int. Cl.³ .................... H01H 9/00; H01H 11/00
[52] U.S. Cl. .................................. 29/832; 200/293; 200/294; 200/296; 248/DIG. 11; 248/DIG. 12
[58] Field of Search .................... 174/57; 29/622, 832, 29/841; 248/314, DIG. 4, DIG. 6, DIG. 11, DIG. 12; 200/292-296

[56] References Cited

U.S. PATENT DOCUMENTS

| 1,572,610 | 2/1926 | Lacks et al. ................ 248/DIG. 11 |
| 3,168,612 | 2/1965 | Sorenson ............................ 248/27.3 |
| 3,237,905 | 3/1966 | Baker et al. ..................... 248/316 D |
| 3,446,467 | 5/1969 | Bailey et al. ........................... 174/57 |
| 3,531,076 | 9/1970 | Bang ............................... 248/316 D |
| 4,032,030 | 6/1977 | Bass et al. ............................. 174/57 |
| 4,180,226 | 12/1979 | Matte ........................... 248/DIG. 6 |

Primary Examiner—Stephen Marcus
Assistant Examiner—Renee S. Kidorf
Attorney, Agent, or Firm—Lawrence I. Field

[57] ABSTRACT

A rectangular switch body has a plurality of terminals of round flexible wire rods and is provided at its four outer side surfaces with engagement members. Various kinds of cross-sectionally C-shaped brackets of a resilient metal plate provided with engagement members are prepared. An insert mount having a mount frame with at least three side walls engageable with at least three side surfaces of the switch body and engagement members is prepared. By using one of the brackets or the insert mount, the switch body is mounted on a printing wiring board in a desired direction or on a panel.

12 Claims, 15 Drawing Figures

U.S. Patent Aug. 20, 1985 4,535,534
FIG. 1(a)
(PRIOR ART)
FIG. 1(b)
(PRIOR ART)
FIG. 1(c)
(PRIOR ART)
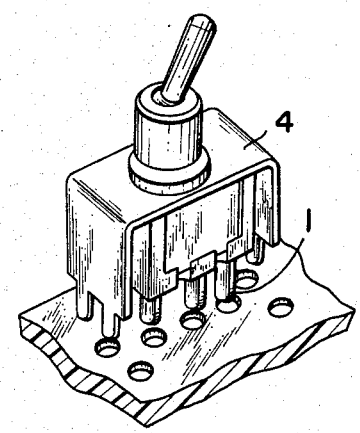
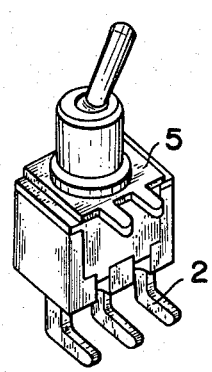
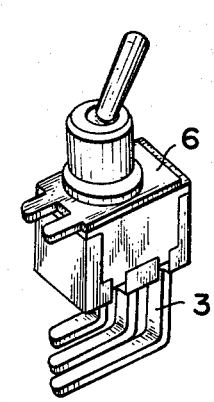
FIG. 2(a)  FIG. 2(b)  FIG. 2(c)
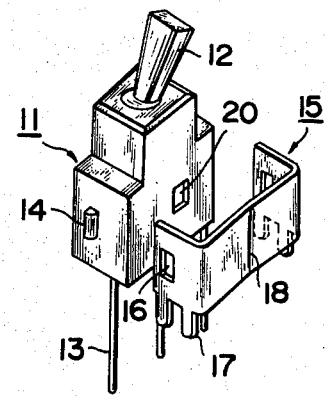
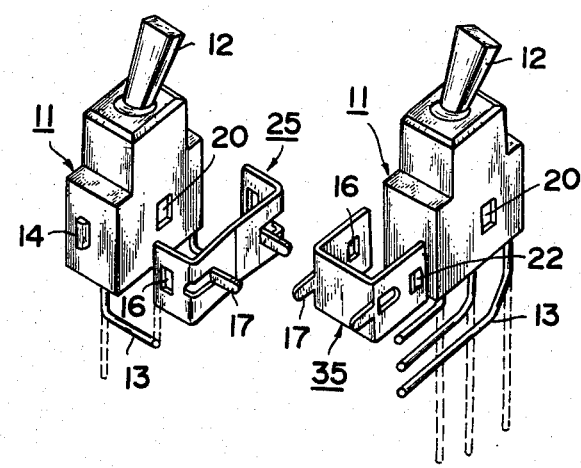

METHOD OF MOUNTING A SWITCH BODY ON A PRINTING WIRING BOARD OR PANEL

CROSS REFERENCE TO RELATED APPLICATION

This application is a continuation-in-part of Ser. No. 284,913 filed July 20, 1981, now abandoned.

BACKGROUND OF THE INVENTION

1. Field of the Invention

This invention relates to a method of mounting a miniature switch and, more particularly, to a method of mounting an extra-small switch on a panel or a printed wiring board selectively.

2. Description of the Prior Art

The terminals of conventional miniature switches for being inserted directly into a printed wiring board are formed as shown in FIGS. 1a, 1b and 1c, by punching a piece of plate. FIG. 1a shows a miniature switch, in which the switch terminals and the legs of a bracket extend in the direction (vertical direction) in which the switch is inserted into a printed wiring board, FIG. 1b shows a miniature switch, in which the switch terminals and the legs of a bracket extend at right angles to the direction in which the handle is oscillated, and FIG. 1c shows a miniature switch, in which the switch terminals and the legs of a bracket extend parallel to the direction in which the handle is oscillated. It is extremely difficult in the above-described miniature switches to bend the terminals thereof (especially, the terminals 2 of the switch shown in FIG. 1b) in such a direction in particular that is at right angles to the direction in which the terminals have been blanked out, i.e. in such a direction that is at right angles to the width of the plate from which the terminals have been blanked out. In the step of assembling such switches, the terminals are set in a switch body by crimping, and the terminals are then bent by using a special jig so as not to crack the switch body. However, when such a terminal-bending operation is conducted by an unskilled worker, unduly great force is applied to those portions of the switch body from which the terminals are projected, since the bending portions of the terminals are close to the mounting portions of the switch body. Such being the case, it is, of course, difficult for switch manufacturers to bend the terminals of switches in accordance with the customer's request, after the switches have been assembled. Also, it is quite difficult for users of the switches to bend the terminals thereof as necessary.

The brackets for conventional switches to be inserted into printed wiring boards, which brackets are used for setting and retaining the switches, have shapes and constructions as shown in FIGS. 1a, 1b and 1c, in which the brackets are designated by reference numerals 4, 5 and 6, respectively. In order to set such brackets, a lower portion of a sleeve or bushing is inserted into a bore in an upper wall of a case cover and a bore in the bracket before the bracket has been mounted on a switch body, and the lower portion of the sleeve is then crimped. The mentioned three parts are joined together in this manner. Since the conventional bracket-carrying switches, which have the above-mentioned constructions, are used in different places, it is naturally quite difficult to replace as necessary the brackets employed therein with different types of brackets after the switch have been assembled. The conventional switches can be classified into three large groups. In other words, substantially three types of switches as shown in FIGS. 1a, 1b and 1c have been manufactured. This makes it necessary to keep three types of switches in stock.

As electronic machines and tools have been miniaturized, the switches used therefor have also been miniaturized increasingly. Under the circumstances, there has been a demand for a method of mounting an extra-small switch on a panel or a printed wiring board selectively.

SUMMARY OF THE INVENTION

An object of the present invention is to meet the above-mentioned demand and eliminate the drawbacks encountered in the prior art switches.

Another object of the present invention is to provide a novel mounting method for miniature switch, in which the miniature switch can be firmly set in a switch body without using a panel-inserting mount, and in which the miniature switch can be detached from a panel and set on a mount for a printed board easily and reliably.

Still another object of the present invention is to provide a novel method for mounting a miniature switch having terminals which can be bent very easily in an arbitrary direction even after the switch has been assembled, and a bracket (receiving metal) or a panel-inserting mount, which is provided with legs for use in firmly setting the switch on a printed board, and which can be detachably set in a switch body as the bracket is directed to an arbitrary side as necessary after the switch has been assembled.

A further object of the present invention is to provide a method for mounting a miniature switch, which has terminals of a flexible material, and a bracket or an inserting mount capable of being detachably set on a switch body, and which thereby allows the number of assembling steps to be reduced by merely manufacturing a basic type of switch, and also the types of the terminals and bracket or inserting mount to be changed easily in accordance with a user's request.

The above objects of the invention can be achieved by providing a miniature switch having a plurality of bendable terminals consisting of wire rods, comprising a switch body having projections or recesses on or in the outer surfaces of side walls thereof, and a cross-sectionally C-shaped bracket having legs (claws) extending in the direction of the length of the switch terminals, and through bores (recesses) or projections in, or on the inner surfaces of, the side walls of the bracket, the bracket being detachably set on the switch body by bringing the through bores (recesses) or projections into engagement with the projections or recesses detachably; or a miniaturized switch having a plurality of bendable terminals consisting of wire rods, comprising a switch body having through bores, recesses or projections in or on the opposite side walls thereof, and a mount frame consisting of three or four side walls to be brought into contact with the outer surfaces of three or four side walls of the switch body, flanges projected outwardly in the opposite directions from upper portions of opposite side walls of the mount frame, elastic plates extending upwardly from those portions of the outer surfaces of the opposite side walls of the mount frame which are below the flanges, and projections, through bores or recesses on or in the relative side walls of the mount frame, the mount frame being detachably set on the switch body as the projections, through bores or recesses on or in the former are brought into engagement with the through bores, recesses or projections in or on the latter, the switch body on which the mount frame has been set being thereby inserted easily with one push into bores in a panel.

The main characteristics of the present invention reside in that an element (bracket) for setting a switch on a printed board and a mount for inserting the switch into a panel can be changed selectively in accordance with requirements to be detachably set on a switch body. In other words, the present invention provides a plurality of types of switches very easily, which can be set arbitrarily in accordance with the requirements on both a panel and a printed board, by merely preparing a single type of switch body and a plurality of types of brackets for mounting switches on a printed board and a plurality of types of mounts for inserting switches into a panel. There is every reason to expect that the present invention contributes much to the standardization and systematization of miniaturized switches.

The above and other objects as well as advantageous features of the invention will become apparent from the following description of the preferred embodiments taken in conjunction with the accompanying drawings.

BRIEF DESCRIPTION OF THE DRAWINGS

FIGS. 1a, 1b and 1c are perspective views of examples of conventional miniature switches of this kind;

FIGS. 2a, 2b and 2c are exploded views in perspective of first, second and third embodiments of miniature switches according to the present invention;

DESCRIPTION OF THE PREFERRED EMBODIMENTS

The characteristics of the present invention will be described specifically with respect to the preferred embodiments thereof with reference to the accompanying drawings.

Figure 3A:
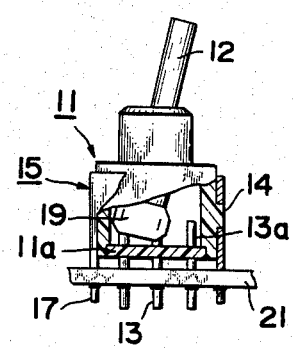
FIGS. 3a, 3b and 3c are side elevational views of the first, second and third embodiments shown in FIGS. 2a, 2b and 2c, which are in practical use.

Referring to FIGS. 2a and 3a, which illustrate a first embodiment of the present invention, reference numeral 11 denotes a switch body, a handle 12 for operating the switch being oscillatably provided at an upper portion of the switch body 11. Terminals 13, each of which consists of a flexible wire rod, are embedded in a lower portion of the switch body, i.e. in a switch base plate 11a. The terminals 13 can be formed integrally with fixed contacts 13a provided so as to be projected into the interior of the switch body 11. Reference numeral 19 denotes a movable contact connected directly or through a switching element (not shown) to the handle 12 and capable of being engaged with the fixed contacts 13a selectively and slidingly.

A bracket (receiving metal) designated generally by a numeral 15 is formed by bending, for example, an elastic plate into a cross-sectionally C-shaped body. The bracket 15 is provided in its side walls, which are formed by bending a plate, with through bores 16 engageable with and disengageable from projections 14 provided on the corresponding side surfaces of the switch body 11. The bracket 15 is also provided at its lower portion with legs (claws) 17, which are projected in the direction of the length of the terminals 13. The projections 14 provided on the switch body 11 may be substituted by recesses, and the through bores 16 in the bracket 15 cooperating with the projections 14 may be changed to projections or tongues. Each of the projections 14 on the switch body 11 has an inclined portion to allow the relative through bores in the bracket 15 to be easily fitted therearound. However, such inclined portions may not necessarily be provided. The side walls of the bracket 15 may be adapted to be opened outwardly to a small extent when the bracket is set on the switch body 11. The bracket 15 is further provided in the central portion thereof with a vertical fold 18. The purpose of providing the fold 18 is to furnish the bracket 15 with a little elasticity by bending the same outwardly in the shape of a letter "V" at the fold 18, and thereby allow the bracket 15 to be set firmly on the switch body 11. However, this fold 18 is not strictly necessary; that portion of the bracket 15 which is provided with the fold 18 may be otherwise flat. Reference numeral 20 denotes a recess. In the first embodiment described above, the switch with the bracket 15 set thereon is inserted and fixed into a printed wiring board 21 as shown in FIG. 3a.

Figure 3B:
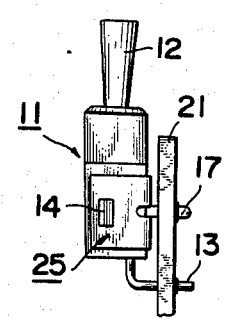

Referring to FIGS. 2b and 3b, which illustrate a second embodiment of the present invention, terminals 13 of a switch are bent at right angles as clearly seen from the drawings, and legs 17 of a bracket 25 are formed so as to be projected in the direction of the length of horizontal portions of the bent terminals 13. In the second embodiment, the switch with the bracket 25 set thereon is inserted and fixed into a printed wiring board 21 as shown in FIG. 3b.

Figure 3C:
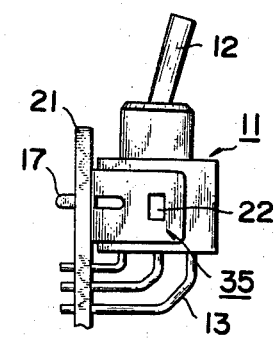

Referring to FIGS. 2c and 3c, which illustrate a third embodiment of the present invention, terminals 13 of a switch are bent in the manner shown therein. A bracket 35 is provided with legs 17, which are projected in the direction of the length of the terminals 13. The bracket 35 is further provided in and on both side walls thereof with a through bore 16 and a tongue 22, which are engageable with a projection (not shown) and a recess 20 provided on and in the corresponding opposite side walls of a switch body 11. The tongue 22 may be substituted by a simple projection. The recess 20 in the switch body may be substituted by a projection, and the tongue 22 on the bracket 35 by a through bore. Although a projection 14 is omitted in FIG. 2c, in practice it is formed on that portion of the switch body 11 which is to be engaged with the inner surface of the bracket 35 between the legs 17 thereof. Accordingly, the above-mentioned portion of the bracket 35 which is to be engaged with the projection 14 will be provided with a through bore, into which the projection 14 is to be fitted. A switch with the bracket 35 set thereon is inserted and fixed into a printed wiring board 21 in the manner shown in FIG. 3c.

The first, second and third embodiments described above of the present invention are miniature switches, which are in most cases inserted directly into a printed wiring board. In these switches, the switch terminals are formed by using flexible wire rods in order that the terminals can be bent arbitrarily as necessary by the manufacturers or users after the switches have been assembled. In addition, projections or recesses are provided on or in the surfaces of the switch body beforehand, and through bores (recesses) or projections which are engageable with and disengageable from the above-mentioned projections or recesses are formed in or on both of side walls of the cross-sectionally C-shaped bracket made of an elastic plate. Owing to such an engaging relation between the switch body and bracket, they can be combined with and separated from each other easily. In the first, second and third embodiments described above, the brackets 15, 25, 35 for use in mounting the switches on printed wiring boards are set on the switch bodies 11. Instead of these brackets, a mount 41 (refer to FIG. 4), which will be described later, for use in mounting the switch on a panel can also be set on the switch body 11.

Therefore, according to the present invention, the terminals 13 can be bent easily in any desired direction as necessary by the manufacturers after the switch has been assembled, or by a user even after the switch has been purchased.

When only one type of switch having switch bodies 11, i.e. basic type switches, and three types of brackets 15, 25, 35 therefor are manufactured and kept in stock, any one of the three types of switches shown in FIGS. 3a, 3b and 3c can be assembled very easily by arbitrarily combining the basic type switch with any one of the brackets 15, 25, 35. This allows the constructions of and the assembling steps for the switches to be simplified, and brings benefit to the manufacturers. Moreover, the dimensions and prices of the switches can be reduced accordingly for the same reasons. Since both the switch terminals and brackets can be assembled selectively with ease in accordance with the orders, the quantities thereof to be stocked can be reduced to a great extent, and the users' requirements can be readily met. In fact, the present invention has a very high practical effect.

Figure 4:
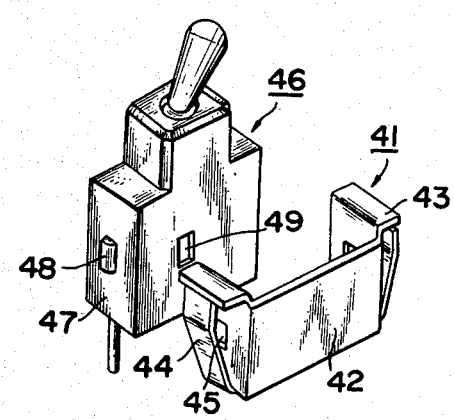
FIG. 4 is an exploded view in perspective of a fourth embodiment of a miniature switch according to the present invention.
Figure 5:
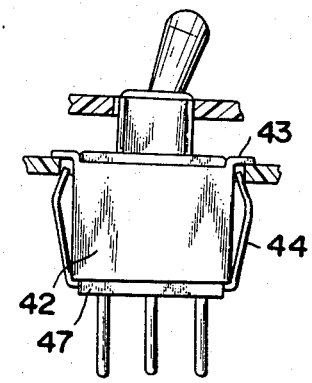
FIG. 5 is a front elevational view of the fourth embodiment shown in FIG. 4.
Figure 6:
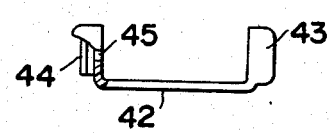
FIG. 6 is a plan view of a switch-inserting mount.

FIGS. 4-6 show a fourth embodiment of the present invention, wherein FIG. 4 is an exploded view in perspective, in which a switch-inserting mount is shown separated from a switch; FIG. 5 is a front elevational view, in which the switch-inserting mount is set on the switch; and FIG. 6 is a plan view of the switch-inserting mount. Referring to the drawings, reference numeral 41 denotes an inserting mount consisting of a cross-sectionally C-shaped metal mount or a mount frame 42 adapted to be engaged with the outer surfaces of three side walls of a switch body 47 of a switch 46, flanges 43 provided at upper portions of and formed integrally with the side walls of the mount frame 42 in such a manner that the flanges 43 extend outwardly in opposite directions, which are parallel to the direction in which the switch is operated, elastic plates 44 each of which extends upwardly from a lower portion of a side wall of the mount frame 42, i.e. that side of a side wall of the mount frame 42 which is opposite to the side thereof from which the flange 43 extends, and through bores 45 provided in the side walls of the mount frame 42 and capable of being engaged with and disengaged from projections 48 provided on the switch body 47. The elastic plates 44, which are formed integrally with the mount frame 42 in this embodiment, may be formed independently of the mount frame 42 to be then joined thereto by, for example, spot welding or a riveting process. The projections 48 may consist of spring type projections which are retracted when a pressure is applied thereto and which are extended again when the pressure is released therefrom. When such spring type projections are employed, the inserting mount can be set on and removed from the switch more easily. The shape and construction of the switch body 47 in this embodiment are the same as those of the switch bodies 11 in the first, second and third embodiments except that the shape of a handle of the fourth embodiment is different from that of the handles in the first, second and third embodiments. Accordingly, the switch body 47 is interchangeable with the switch body 11. Also, it is possible to set the above-mentioned bracket (refer to FIG. 2a) on the switch body 47 instead of the inserting mount 41.

Figure 7:
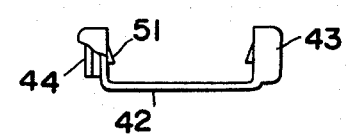
FIG. 7 is a plan view of a modified example of the switch-inserting mount.

FIG. 7 is a plan view of a modified example of the inserting mount. This modified example is substantially identical with the inserting mount 41 used in the fourth embodiment described above except that the former is provided with projections or claws 51 instead of the through bores 45 provided in the latter. Consequently, when this modified example is practically used, it is necessary that the switch body 47 be provided with recesses, which are engageable with the projections or claws 51, instead of the projections 48.

Figure 8:
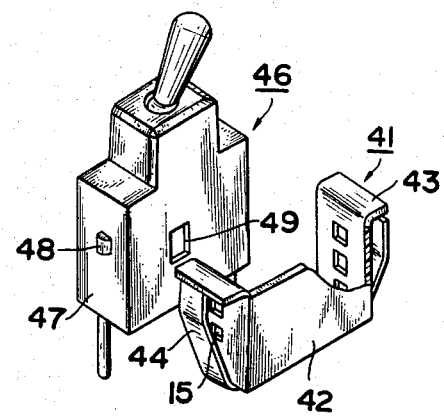
FIG. 8 is an exploded view in perspective of a fifth embodiment of a miniature switch according to the present invention.

FIG. 8 shows in perspective a fifth embodiment of the present invention, in which an inserting mount is shown separated from a switch. This embodiment is different from the above-described fourth embodiment in that the former is provided with a plurality of vertically spaced through bores 45 in each of side walls of the mount frame 42 to allow the inserting mount to be set on the switch in a position selected from various vertically spaced positions. Thus, this embodiment is characterized in that the distance between an operating element and flanges can be regulated suitably in accordance with different modes of use of the switch, or in accordance with, for example, a case in which the switch is inserted into an ordinary single panel, or a case in which the switch is inserted into a panel of a doubly-constructed system, a so-called double panel. Instead of the construction shown in FIG. 8, a plurality of vertically spaced recesses and the same number of projections engageable therewith may, of course, be provided in the side walls of a switch body 47 and the mount frame 42, respectively.

Figure 9:
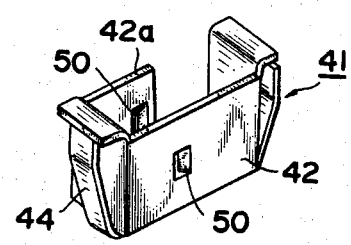
FIG. 9 is a perspective view of another modified example of the switch-inserting mount.

FIG. 9 is a perspective view of another modified example of the inserting mount. The inserting mount in this modified example is so designed that it is engaged at the surfaces of four side walls thereof with a switch body. Namely, the inserting mount 41 in this modified example has a four-sided construction, and is identical with the mount frame 42, which is shown in the drawings of the above-described embodiments, except that the former has a partially cutaway major wall 42a which is opposed to the major wall 42 of the mount 41 and which is integrally formed with one of the side walls thereof. These two major walls of the inserting mount 41 are provided with projections or claws 50, which are engageable with recesses 49 (refer to FIGS. 4 and 8) formed in the switch body. Instead of this construction, the recesses in the switch body and the projections 50 on the inserting mount 41 can, of course, be changed to projections and recesses, respectively.

Since the inserting mounts in the fourth and fifth embodiments of the present invention are brought into engagement at three or four side surfaces thereof with the corresponding three or four side surfaces of the switch body as mentioned above, the inserting mounts and the switch bodies can be combined together firmly. The switch has become capable of being stored and sold with an inserting mount set on a switch body thereof.

The inserting mount employed in the present invention has a simple construction, and, therefore, it can be manufactured at a low cost. Moreover, the inserting mount can be set on and separated from a switch body very easily.

The inserting mount used in the present invention can also be applied in the same manner to rocker switches, push-button switches and display lamps.

Although the invention has been described in its preferred embodiments, such description is for illustrating purposes only, and has no restrictive meanings, of course. Accordingly, the invention can be practiced by adding various changes and modifications thereto without departing from the spirit of the invention, and all such changes and modifications fall within the scope of the invention.

What is claimed is:

1. A method of mounting an miniature switch on a printed wiring board or panel using one of a plurality of a different brackets, comprising the steps of:
   (A) preparing a rectangular switch body having a plurality of terminals of round flexible wire rods and provided at its four outer side surfaces with first engagement members;
   (B) preparing more than two different cross-sectionally C-shaped brackets of a resilient metal plate, each having a plurality of legs and provided at opposite side surfaces of said bracket with second engagement members;
   (C) preparing a plurality of different inserting mounts having a mount frame with at least three side walls engageable with at least three side surfaces of said switch body, flanges outwardly extending in opposite directions from upper portions of two opposite side walls of said mount frame, elastic plates upwardly extending from those portions of the outer surfaces of said opposite side walls of said mount frame which are below said flanges, and second engagement members provided on opposite portions of said side walls;
   (D) selecting one of the brackets or the inserting mounts of steps (B) and (C) above in accordance with an intended position of the printed wiring board or panel;
   (E) mounting said switch body to said selected bracket or inserting mount by engaging the second engagement members of the selected bracket or inserting mount with selected portions of the first engagement members of the switch body; and
   (F) mounting said switch body together with said selected bracket or inserting mount onto the printed wiring board or panel.

2. The method of claim 1 including, in addition, the step of bending said plurality of terminals of said switch body toward the direction of said intended position of the printed wiring board or panel prior to mounting said switch body and said selected bracket or inserting mount onto said printed wiring board or panel.

3. The method according to claim 1, wherein in said engaging step said first engagement members consist of projections, said second engagement members consisting of through bores.

4. The method according to claim 1, wherein in said engaging step said first engagement members consist of projections, said second engagement members consisting of recesses.

5. The method according to claim 1, wherein in said engaging step said first engagement members consist of recesses, said second engagement members consisting of tongues.

6. The method according to claim 1, wherein in said engaging step said first engagement members consist of recesses, said second engagement members consisting of projections.

7. The method according to claim 1, wherein in step (D) (i) said first engagement members consist of projections, said second engagement members consisting of through bores.

8. The method according to claim 1, wherein in step (D) (i) said first engagement members consist of projections, said second engagement members consisting of recesses.

9. The method according to claim 1, wherein in step (D) (i) said first engagement members consist of recesses, said second engagement members consisting of claws.

10. The method according to claim 1, wherein in step (D) (i) said first engagement members consist of recesses, and in step (D) (ii) said second engagement members consist of projections.

11. The method according to claim 1, wherein in step (D) (i) said first engagement members consist of projections or claws, and in step (D) (ii) said second engagement members consisting of a plurality of sets of through bores or recesses selectively engageable with said projections or claws, each set of said through bores or recesses being arranged in a vertically spaced manner in one of opposite side walls of said mount frame.

12. The method according to claim 1, wherein in step (D) (i) said first engagement members consist of a plurality of sets of recesses, each set of said recesses being arranged in a vertically spaced manner in one of opposite side walls of said switch body, and in Step (D) (ii) said second engagement members consisting of projections or claws selectively engageable with one pair of opposite recesses out of said plural sets of recesses.

* * * * *